LOW TEMPERATURE-HIGH VACUUM CONTACT FORMATION PROCESS

Filed Oct. 31, 1968

INVENTORS:
THEODORE R. COX,
CLAIR E. LOGAN,

BY Robert J. Mooney
THEIR ATTORNEY.

United States Patent Office 3,567,508
Patented Mar. 2, 1971

3,567,508

LOW TEMPERATURE-HIGH VACUUM CONTACT FORMATION PROCESS

Theodore R. Cox, Canastota, and Clair E. Logan, North Syracuse, N.Y., assignors to General Electric Company

Filed Oct. 31, 1968, Ser. No. 772,099
Int. Cl. B44d *1/18*
U.S. Cl. 117—212 8 Claims

ABSTRACT OF THE DISCLOSURE

This invention relates to an improved method of forming a metallic electrical contact on a semiconductor body having an insulating cover provided with at least one contact locating aperture exposing a portion of the top surface of the body, and wherein the insulating cover is itself covered or coated with a selectively-patterned mask of heat-removable material such as a layer of organic photoresist. A layer of metal is deposited by condensation from the vapor state, in a vacuum of about $1.0 \times 10^{-6}$ torr over the surface of the photoresist layer and the surface of the body exposed through the aperture, while maintaining the semiconductor material and photoresist at a temperature slightly below that at which the photoresist begins to char. After the deposition of the metal, removal of the photoresist material together with the portion of the metal layer overlying the photoresist is accomplished by a one-shot heating step, by which the photoresist and the semiconductor material are heated to a temperature in the range of 400 to 570° C. This heating also sinters the un-removed portion of the metal layer to the semiconductor body to provide a non-rectifying electrical connection of increased mechanical strength.

This invention relates to semiconductor devices. More particularly, the invention relates to electrical contacts for the semiconductor bodies of such devices, and to a method of making the same.

In most classes of semiconductor devices it is important to provide an electrical contact that is permanent, mechanically sturdy and of low resistance. Various types of metals and combinations of metals such as aluminum, gold, silver, titanium, etc. are used as shown in the prior art to make these electrode connections, but their application usually requires the employment of high temperatures which sometimes adversely affect adjacent PN junctions or other electrical properties of the semiconductor body. In many such instances it is also required that the metal contact be confined to a specific, precisely located, minute area, which may have dimensions of the order of .0001 inch. Photolithographic techniques are often employed to accommodate this latter requirement, and with such techniques the high temperatures above noted increase the difficulties of locating the metallic regions of the contacts only where desired, as well as the difficulty of removing extraneously deposited contact metal from places where it is not desired. Therefore, a contact forming process has long been sought that can better accommodate the foregoing requirements without deleteriously affecting adjacent PN junctions or other electrical characteristics of finished devices.

One prior art method used to form small-geometry semiconductor contacts is described in U.S. Pat. 3,108,359. This process involves placing a layer of a suitable photoresist over the entire surface of a suitable insulating layer previously applied to a semiconductor body. The photoresist is then photographically exposed to a desired pattern and developed to uncover desired areas of the insulating layer. Then using a suitable etchant, such as a dilute solution of hydrofluoric acid in deionized water, contact apertures are etched in the insulating layer. After the photoresist is removed, a contact metal such as aluminum is deposited over the remaining surface of the insulating layer as well as the portions of the surface of the semiconductor body exposed by the contact apertures. After the contact metal is deposited, a second layer of photoresist is placed over the entire surface of the contact material. The second layer of photoresist is then suitably exposed and developed to remove it all except that portion covering the contact metal deposited in the contact apertures. Next, the semiconductor body is placed in a suitable etchant for the contact metal (for example, aluminum can be etched in a solution of 25% sodium hydroxide and 75% deionized water) to remove the exposed contact metal. The remainder of the photoresist is removed and the metal contact is then generally sintered or alloyed in a furnace to assure a non-rectifying contact of negligible resistance.

The above-described prior art process when used to form a contact suffers from the following disadvantages. First, this process requires a large number of costly processing steps. Second, the etching operation needed to remove the exposed contact metal is very difficult to control because the etchant attacks the contact metal very rapidly and hence may cause poor definition of the contact aperture and may also attack the insulating layer, thereby decreasing device reliability.

Accordingly, one object of this invention is to provide a simplified, improved and less expensive contact-forming process that produces a well-defined metallic contact, and avoids the principal shortcomings of prior art contact-forming processes.

Another object of this invention is to provide a more economical method of forming in a predetermined location on a semiconductor body an electrical contact.

Another object of this invention is to eliminate the need of using etch solutions to remove any unwanted metal.

Another object of this invention is to provide a contact-forming process that uses heat-removable material to locate the contact apertures, and that prevents such heat-removable from embedding itself in, or otherwise contaminating, the insulating layer that covers at least part of the surface of the semiconductor body.

These and other objects of this invention will be apparent from the following description and the accompanying drawings, wherein.

Similar reference numerals are applied to similar elements throughout the drawing.

Figure 1:
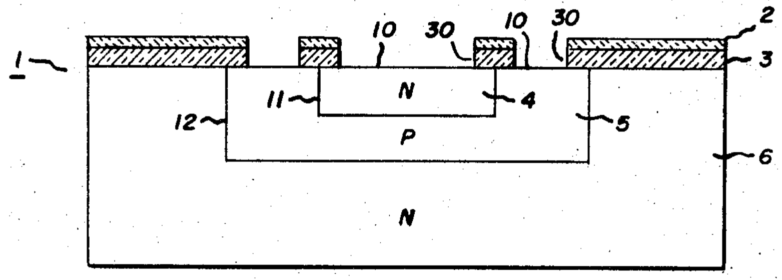
FIG. 1 shows a cross-sectional view of an NPN transistor pellet to which this invention is particularly applicable.

In FIG. 1 there is shown a semiconductor device 1 embodying a portion of the contact process of the present invention. The semiconductor device shown is a planar NPN transistor and the semiconductor substrate material is of N-type conductivity silicon. The NPN transistor 1 is comprised of an emitter region 4, a base region 5, and a collector region 6. The exposed top surfaces of silicon are indicated by the contact interfaces 10. The two internal junctions, i.e. the emitter-base junction 11 and the 11 and the collector-base junction 12, are covered by an insulating layer 3 which may be, for example an oxide of silicon. All of the methods needed to form the above portions of the NPN transistor 1 are well known to those skilled in the art and are not part of this invention.

A layer of heat-removably masking material 2 such as Eastman Kodak KMER photoresist completely covers the top surface of the insulating layer 3.

Figure 2:
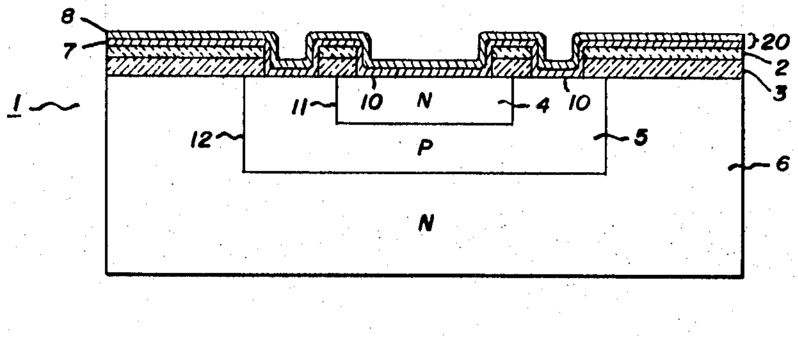
FIG. 2 shows a cross-sectional view of the NPN transistor pellet of FIG. 1 at an intermediate stage in the process of the present invention.

FIG. 2 shows a cross-sectional view of an exemplary contact structure 20 obtained during the initial processing steps of one embodiment of this invention. This contact is formed on the semiconductor body shown in FIG. 1 as follows. A first layer 7 of an active metal, i.e. a metal selected for the excellent quality of its adherence to the semiconductor body, is applied to the top surface of the photoresist layer 2 and to the contact interfaces 10. The active metal 7 may be, for example, a metal from the group consisting of titanium, vanadium, chromium, niobium, zirconium, palladium, tantalum and intermetallic compounds thereof. A second layer 8 of a contact metal, i.e. a metal selected for the excellent quality of its soldering and bonding properties to external leads or electrodes is then applied over the first layer 7. The contact metal may be, for example, a metal from the group consisting of aluminum, silver, gold, platinum and intermetallic compounds thereof. It should be noted that either the active layer 7 or the contact layer 8 could be applied separately as taught by this invention.

One detailed example will now be described of a suitable method of forming the metal layers 7 and 8 in apertures 30 in accordance with the present invention as shown in FIG. 2. Before applying the contact to the surface of the photoresist 2 and the interfaces 10, it is desirable to first clean and maintain the interfaces 10 relatively free of any oxide. This is important in order to ensure good adherence of the contact to the silicon. The first step in cleaning the interfaces 10 is to degrease the pellet 1 in suitable solvents, such as in solutions of trichloroethylene and methanol. This is followed by a deionized water rinse and drying step in a nitrogen atmosphere. The unwanted silicon oxide in the contact interfaces 10 is then removed, for example by a suitable hydrofluoric acid etching. This cleaning of interfaces 10 has an advantage over the prior art in that, since the photoresist layer does not have to be removed after the cleaning step, as required in the etch process previously described, the chances of the interfaces 10 reoxidizing are reduced because the photoresist removal processing steps that allow the exposed silicon surfaces of the apertures additional time to oxidize are eliminated.

Next, the various metallic layers constituting the metallic contact 20 are deposited on the surfaces of the photoresist 2 and in the contact apertures 30. Any suitable method of vacuum deposition that maintains a vacuum of at least $1.0 \times 10^{-6}$ torr can be used. For example, after the semiconductor body 1 is formed as shown in FIG. 1, the pellet 1 is placed in a vacuum chamber and a vacuum of about $1.0 \times 10^{-6}$ torr is maintained. It has been discovered that for reasons not fully understood the degree of vacuum has a beneficial effect in helping to diminish the contamination of the insulating layer 3 that frequently occurs as a result of the presence of the photoresist layer 2 and to reduce the adherence of the photoresist layer 2 to the insulating layer 3. Next, using suitable deposition means such as filament thermal-resistance deposition, an active metal layer 7 of titanium and a contact metal layer 8 of aluminum are applied to the surface of the photoresist 2 and to the apertures 30. Other appropriate means of deposition include sputtering and electron beam deposition.

In order to remove the unwanted metal (i.e. portions of layers 7 and 8) on top of the photoresist layer 2, it is necessary to begin to loosen the photoresist layer 2 from the insulating layer 3. This has been found to occur when the body 1 and photoresist layer 3 are heated. However, it has been found that if a temperature greater than that at which the photoresist begins to char is used, certain constituents of the photoresist layer 2 will begin to impregnate or otherwise contaminate the insulating layer 3. This is a result which is highly undesirable because such constituents, particularly when they include sodium, potasium, or other elements which produce mobile ions, as is generally the case with presently commercially available photoresist materials, subsequently cause poor electrical stability in the operation of the finished device. These impurities may also contaminate the contact layers 7 and 8 themselves, thereby deleteriously affecting the device. Therefore, during the application of the first layer 7 and second layer 8, the pellet 1 and the photoresist layer 2 are maintained at a predetermined elevated temperature, which promotes loosening of the pohtoresist layer 2, but which is below the temperature at which significant contamination of the insulating layer 3 by the photoresist material 2 occurs and below the temperature at which the photoresist material 2 beings to char. When there is used an organic photoresist such as that known commercially as "KMER" and manufactured by Eastman Kodak Company, the desired predetermined temperature is in the range between 150 and 210° C.

Once the titanium and aluminum layers 7 and 8 are deposited, the pellet 1 is heated, for example, in a furnace having a nitrogen cover gas, for about 30 minutes to a temperature in the range of 400–570° C. This heating step acts to loosen and remove by decomposition substantially all of the photoresist material 2 and the portion of the first and second layers 7 and 8 on the photoresist 2. Continuation of this heating treatment sinters the two layers 7 and 8 to the semiconductor body 1 and forms well-adhered non-rectifying contacts with the contact interfaces 10. If desired, the top surface of insulating layer 3 may be subjected to a supplemental cleaning treatment, for example by immersion in an ultrasonically agitated bath of deionized water.

Figure 3:
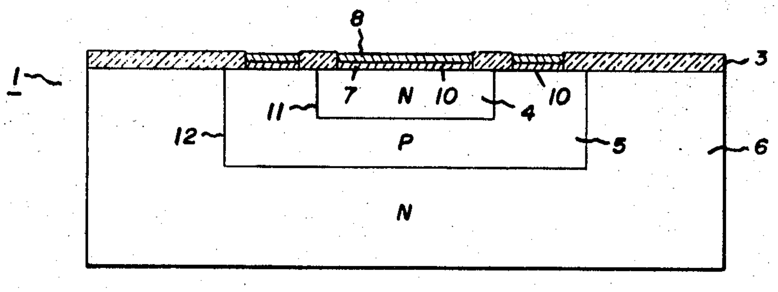
FIG. 3 shows a cross-sectional view of an NPN transistor pellet of FIG. 1 following completion of the process of the present invention.

FIG. 3 shows a cross-sectional view of a completed form of one embodiment of a contact system 20 constructed in accordance with this invention. All the photoresist layer 2 shown in FIG. 2 has been removed from the structure of FIG. 3 along with any unwanted layers (i.e. portions of layers 7 and 8) on top of it. Layers 7 and 8 are restricted to the contact locating apertures 30.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. The method of producing a metallic contact on a body of semiconductor material having an insulating layer contiguous with its top surface and provided with at least one contact locating aperture exposing a portion of the top surface of said body, said insulating layer being clad with a mask of heat-removable material which when heated above its charring temperature may contaminate or impregnate said insulating layer, said method comprising the steps of:

(a) depositing by vacuum deposition in a vacuum of about $1.0 \times 10^{-6}$ torr at least one layer of metallic material over the surface of said heat-removable mask and the surface of said body exposed through said aperture while maintaining said semiconductor body and said heat-removable mask thereon at a temperature below that at which said mask begins to char thereby preventing the heat-removable material from impregnating said insulating layer;

(b) heating said heat-removable mask to a sufficient temperature in the range of 400 to 570° C. to loosen and remove said heat-removable material and the portion of said metallic layer thereon; and (c) continuing said heating thereby sintering said layer of metallic material to said body in order to form a nonrectifying contact thereto within said aperture.

2. The method of producing a metallic contact as defined in claim 1 wherein said metallic layer comprises an active metal from the group consisting of titanium, vanadium, chromium, zirconium, niobium, palladium, tantalum, and intermetallic compounds thereof; and said heat-removable material consists of an organic photoresist.

3. The method of producing a metallic contact as defined in claim 2 wherein after the last-mentioned heating step said body is placed in an ultrasonically agitated bath to remove any remaining portions of said photoresist material and said metallic layer covering said photoresist.

4. The method of producing a metallic contact as defined in claim 1 wherein: said metallic layer comprises a contact metal from the group consisting of aluminum, gold, silver, platinum, and intermetallic compounds thereof; said heat-removable material consists of Eastman Kodak KMER resist; and the first-mentioned temperature is in the range of 150–210° C.

5. The method of producing a metallic contact as defined in claim 4 wherein after the last-mentioned heating step said body is placed in an ultrasonically agitated bath to remove any remaining portions of said photoresist material and said layer covering said photoresist.

6. The method of producing a metallic contact on a body of semiconductor material having an insulating layer contiguous with its top surface and provided with at least one contact locating aperture exposing a portion of the top surface of said body and said insulating layer, said insulating layer being clad with a mask of photoresist material which when heated above its charring temperature may contaminate or impregnate said insulating layer, said method comprising the steps of:

(a) depositing by vacuum deposition in a vacuum of about $1.0 \times 10^{-6}$ torr at least one layer of metallic material over the surface of said photoresist and the surface of said body and said insulating layer exposed through said aperture while maintaining said semiconductor body and said photoresist at a temperature slightly below that at which said photoresist just begins to char thereby preventing said photoresist from impregnating said insulating layer;

(b) heating said heat-removable mask to a sufficient temperature in the range of 400 to 570° C. to loosen and remove substantially all of said photoresist material and the portion of said metallic layer on said photoresist layer; and (c) continuing said heating thereby sintering said layer to said body in order to form a non-rectifying contact thereto within said aperture.

7. The method of producing a metallic contact on a body of semiconductor material having an insulating layer contiguous with its top surface and provided with at least one contact locating aperture exposing a portion of the top surface of said body, said insulating layer being clad with a mask of photoresist material which when heated above its charring temperature may contaminate or impregnate said insulating layer, said method comprising the steps of:

(a) depositing by vacuum deposition in a vacuum of about $1.0 \times 10^{-6}$ torr a first layer of active metal over the surface of said photoresist and the surface of said body exposed through said aperture while maintaining said semiconductor body and said photoresist thereon at a temperature slightly below that at which the photoresist just begins to char thereby preventing the photoresist material from impregnating said insulating layer;

(b) depositing by vacuum deposition at about said vacum a second layer of contact metal over said first layer while maintaining said semiconductor body and said photoresist thereon at a temperature slightly below that at which the photoresist just begins to char thereby preventing the photoresist material from impregnating said insulating layer;

(c) heating said photoresist to a sufficient temperature in the range of 400 to 570° C. to loosen and remove substantially all of said photoresist material and the portions of said first and second layers on said photoresist material;

(d) continuing said heating thereby sintering the non-removed portions of said layers to said body in order to form a non-rectifying contact thereto within said aperture; and (e) placing said body in an ultrasonically agitated bath to remove any remaining portions of said photoresist materials and said layers covering said photoresist.

8. The method of producing a metallic contact on a body of semiconductor material as recited in claim 7 wherein said first layer is titanium; said second layer is aluminum; said photoresist is Eastman Kodak KMER; said first-mentioned temperature is in the range of 150–210° C.; and said bath contains deionized water.

References Cited

UNITED STATES PATENTS

| | | | |
|---|---|---|---|
| 2,139,640 | 12/1938 | Mall et al. | 117—5.5X |
| 2,728,693 | 12/1955 | Cado | 117—5.5X |
| 2,923,624 | 2/1960 | Hensler | 117—5.5X |
| 2,999,034 | 9/1961 | Heidenhain | 117—5.5 |
| 3,020,156 | 2/1962 | Rowe | 96—36.2 |

ALFRED L. LEAVITT, Primary Examiner
W. F. CYRON, Assistant Examiner

U.S. Cl. X.R.

96—36.2, 46; 117—5.5, 107